US012471312B2

(12) United States Patent
Saito et al.

(10) Patent No.: US 12,471,312 B2

(45) Date of Patent: Nov. 11, 2025

(54) SWITCHING ELEMENT

(71) Applicant: DENSO CORPORATION, Kariya (JP)

(72) Inventors: Jun Saito, Toyota (JP); Youngshin Eum, Kariya (JP); Keita Kataoka, Nagakute (JP); Yusuke Yamashita, Nagakute (JP); Yukihiko Watanabe, Nagakute (JP); Katsuhiro Kutsuki, Nagakute (JP)

(73) Assignee: DENSO CORPORATION, Kariya (JP)

( * ) Notice: Subject to any disclaimer, the term of this patent is extended or adjusted under 35 U.S.C. 154(b) by 799 days.

(21) Appl. No.: 17/747,293

(22) Filed: May 18, 2022

(65) Prior Publication Data

US 2022/0278231 A1 Sep. 1, 2022

Related U.S. Application Data

(63) Continuation of application No. PCT/JP2019/045858, filed on Nov. 22, 2019.

(51) Int. Cl.

| | |
|---|---|
| ***H10D 30/66*** | (2025.01) |
| ***H10D 62/17*** | (2025.01) |
| ***H10D 62/832*** | (2025.01) |
| ***H10D 64/27*** | (2025.01) |

(52) U.S. Cl.

CPC ......... *H10D 30/668* (2025.01); *H10D 62/393* (2025.01); *H10D 62/8325* (2025.01); *H10D 64/513* (2025.01)

(58) Field of Classification Search

CPC ............. H01L 29/7813; H01L 29/7397; H01L 29/0696; H01L 29/1095; H10D 30/668; H10D 62/393; H10D 62/8325; H10D 64/513; H10D 62/107; H10D 62/127

See application file for complete search history.

(56) References Cited

U.S. PATENT DOCUMENTS 7,947,555 B2 * 5/2011 Akiba ................ H10D 62/8325 438/270
9,306,061 B2 4/2016 Cheng et al.
2009/0114969 A1 * 5/2009 Suzuki ................. H10D 30/635 257/E21.054
2009/0166730 A1 7/2009 Okuno et al.
2014/0175459 A1 * 6/2014 Yamamoto ........... H10D 12/038 257/77
2020/0161467 A1 5/2020 Takeuchi et al.

FOREIGN PATENT DOCUMENTS

JP 2019016775 A * 1/2019 ............. H01L 29/06

* cited by examiner

*Primary Examiner* — Jonathan Han

(74) *Attorney, Agent, or Firm* — Posz Law Group, PLC

(57) ABSTRACT

A switching element includes a semiconductor substrate, a gate insulating film, and a gate electrode that is disposed inside the trench. The semiconductor substrate further includes: an n-type source region, a p-type body region, an n-type drift region, a p-type first electric field reduced region, and a p-type connection region. When a permittivity of the connection region is ε (F/cm), a critical electric field strength of the connection region is Ec (V/cm), an elementary charge is e (C), an area density of p-type impurity when viewed in a plan view of the connection region located below the trench is Q ($cm^{-2}$), $Q>\varepsilon*Ec/e$.

3 Claims, 5 Drawing Sheets

10 p+ III 22 II V IV 12a 26 24 24a 24b 34 35 n n- n+ p 12 30 32a 32b 32 36 38 12b 72 z y x

SWITCHING ELEMENT

CROSS REFERENCE TO RELATED APPLICATIONS

This application is a continuation application of International Patent Application No. PCT/JP2019/045858 filed on Nov. 22, 2019 which designated the U.S. The entire disclosure of all of the above application is incorporated herein by reference.

TECHNICAL FIELD

The present disclosure relates to a switching element

BACKGROUND ART

A typical switching element includes a semiconductor substrate and a gate electrode. A trench is provided on an upper surface of the semiconductor substrate. A gate electrode is arranged in the trench. The gate electrode is insulated from the semiconductor substrate by the gate insulating film. The semiconductor substrate has a source region, a body region, a drift region, and an electric field reduced region (in other words, a bottom region). The source region is an n-type region in contact with the gate insulating film at a side surface of the trench. The body region is a p-type region in contact with the gate insulating film at the side surface of the trench below the source region. The drift region is an n-type region that is arranged below the body region and is in contact with the gate insulating film at the side surface of the trench below the body region and at a bottom surface of the trench. The electric field reduced region is a p-type region that is arranged inside the drift region and is arranged under the trench with a space from the bottom surface of the trench.

SUMMARY

One aspect of the present disclosure is a switching element including: a semiconductor substrate that has an upper surface on which a trench is disposed; a gate insulating film that covers an inner surface of the trench; and a gate electrode that is disposed inside the trench. The gate electrode is insulated from the semiconductor substrate by the gate insulating film. The semiconductor substrate further includes: an n-type source region in contact with the gate insulating film on a side of the trench; a p-type body region in contact with the gate insulating film on the side below the source region; an n-type drift region that is arranged below the body region, the n-type drift region being in contact with the gate insulating film on the side below the body region and with the gate insulating film at a bottom surface of the trench; a p-type first electric field reduced region that is arranged inside the drift region below the trench to be spaced away from the bottom surface of the trench, the p-type first electric field reduced region extending along the bottom surface of the trench; and a p-type connection region that protrudes downward from the body region to reach the first electric field reduced region, the p-type connection region extending in a direction intersecting the trench when viewed in a plan view. When a permittivity of the connection region is ε (F/cm), a critical electric field strength of the connection region is Ec (V/cm), an elementary charge is e (C), and an area density of p-type impurity when viewed in a plan view of the connection region located below the trench is Q ($cm^{-2}$), $Q>\varepsilon*Ec/e$. A p-type impurity concentration in the connection region is higher than a p-type impurity concentration in the first electric field reduced region.

BRIEF DESCRIPTION OF DRAWINGS

The above and other objects, features and advantages of the present disclosure will become more apparent from the following detailed description made with reference to the accompanying drawings.

DESCRIPTION OF EMBODIMENTS

Figure 1:
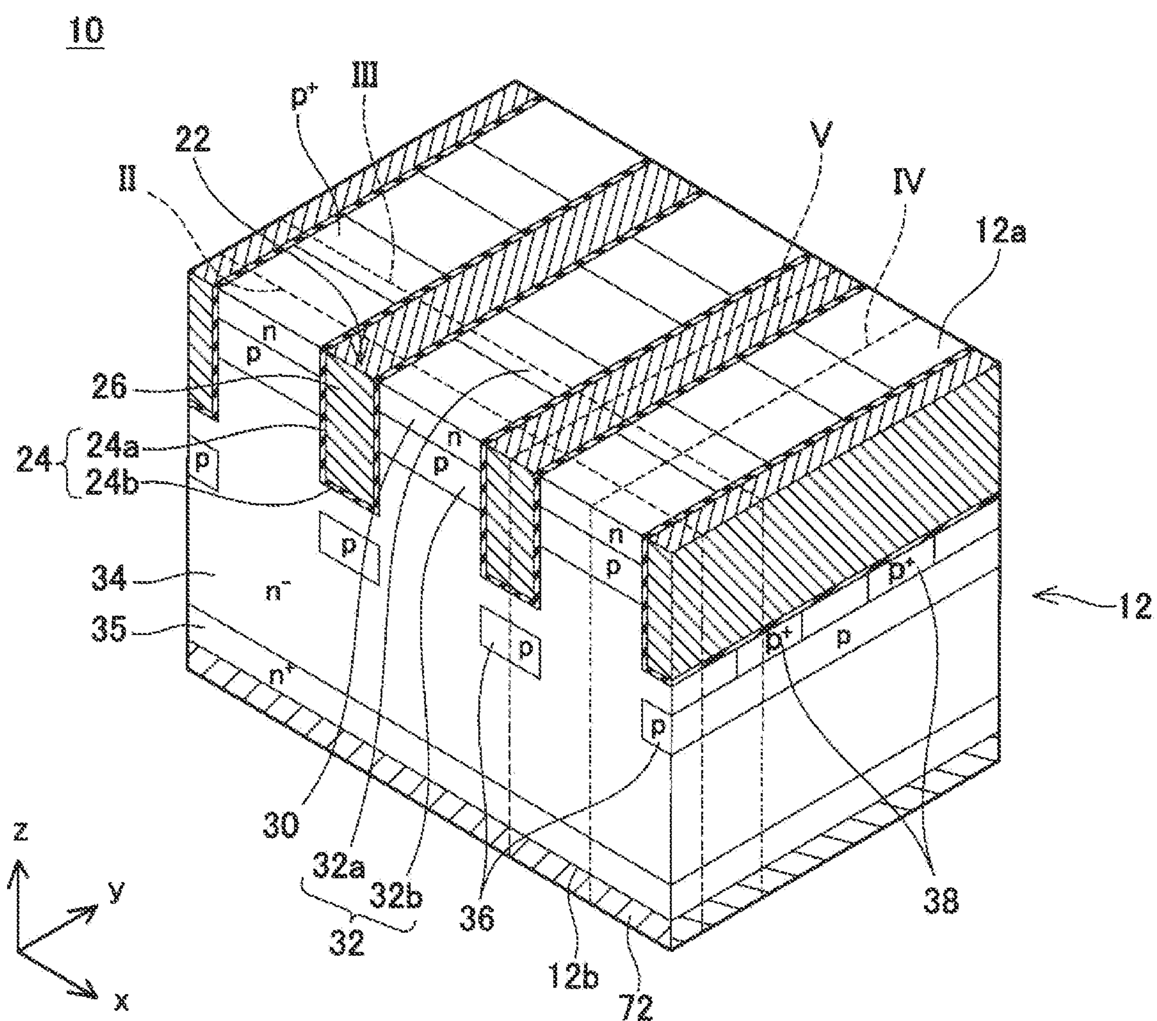
FIG. 1 is a perspective view of a cross-section of a MOSFET according to a first embodiment.

To begin with, a relevant technology will be described only for understanding the following embodiments.

In the above-described switching element, when an avalanche breakdown occurs, some of holes generated around the electric field reduced region enter into the gate insulating film during the process of flowing from the drift region to the body region. This causes a problem that the characteristics of the gate insulating film change and the gate threshold varies. This disclosure proposes a technique to reduce a change in the characteristics of the gate insulating film when an avalanche breakdown occurs.

As described above, according to the one aspect of the present disclosure, a switching element includes: a semiconductor substrate that has an upper surface on which a trench is disposed; a gate insulating film that covers an inner surface of the trench; and a gate electrode that is disposed inside the trench. The gate electrode is insulated from the semiconductor substrate by the gate insulating film. The semiconductor substrate further includes: an n-type source region in contact with the gate insulating film on a side of the trench; a p-type body region in contact with the gate insulating film on the side below the source region; an n-type drift region that is arranged below the body region, the n-type drift region being in contact with the gate insulating film on the side below the body region and with the gate insulating film at a bottom surface of the trench; a p-type first electric field reduced region that is arranged inside the drift region below the trench to be spaced away from the bottom surface of the trench, the p-type first electric field reduced region extending along the bottom surface of the trench; and a p-type connection region that protrudes downward from the body region to reach the first electric field reduced region, the p-type connection region extending in a direction intersecting the trench when viewed in a plan view. When a permittivity of the connection region is ε (F/cm), a critical electric field strength of the connection region is Ec (V/cm), an elementary charge is e (C), and an area density of p-type impurity when viewed in a plan view of the connection region located below the trench is Q ($cm^{-2}$), $Q > \varepsilon * Ec/e$. A p-type impurity concentration in the connection region is higher than a p-type impurity concentration in the first electric field reduced region.

When this switching element is turned off, an electric field tends to concentrate in an area where the connection region and the first electric field reduced region are connected to each other. Therefore, in the switching element, avalanche breakdown occurs around the area where the connection region and the first electric field reduced region are connected to each other. The holes generated due to the avalanche breakdown flow to the body region via the connection region. Further, in this switching element, since the area density Q satisfies the above equation, the depletion layer spreading in the connection region does not reach the lower end of the trench. That is, a non-depleted region (i.e., a region where the depleted region does not exit) remains in the connecting region around the lower end of the trench. The non-depleted region prevents the holes flowing through the connection region (i.e., the holes generated around the connection region due to avalanche breakdown) from entering into the gate insulating film. Therefore, according to the switching element, even when an avalanche breakdown occurs, it is possible to suppress a change in characteristics of the gate insulating film.

Next, a plurality of embodiments of the present disclosure are now described with reference to drawings.

The technical elements disclosed herein are listed below. The following technical elements are useful independently.

In an example configuration disclosed herein, the semiconductor substrate is made of silicon carbide and may satisfy $Q > 1.49*10^{13}$.

In another example configuration of the present disclosure, the trench are a plurality of trenches on the upper surface of the semiconductor substrate, the connection region are a plurality of connection regions, the first electric field reduced region are a plurality of first electric field reduced regions, the switching element further includes a plurality of p-type second electric field reduced regions, each of the plurality of first electric field reduced regions is located below a corresponding one of the plurality of trenches, each of the plurality of connection regions extends to intersect the plurality of trenches, and each of the plurality of second electric field reduced regions is located below a corresponding one of the plurality of connection regions, is connected to the corresponding one of the plurality of connection regions, and extends to intersect the plurality of first electric field reduced regions.

In such a configuration, when the switching element is off, the concentration of the electric field around the lower end of the connection region is prevented. Further, the first electric field reduced region and the second electric field reduced region are arranged in a grid pattern in a plan view. Therefore, when the switching element is turned off, in the drift region surrounded by the first electric field reduced region and the second electric field reduced region, the depletion layer quickly expands from the first electric field reduced region and the second electric field reduced region. In this way, since the depletion layer spreads rapidly in the drift region, the capacitance between the drain and the source of the switching element can be reduced.

In the configuration of one example disclosed herein, the p-type impurity concentration in the connection region may be higher than the p-type impurity concentration in the first electric field reduced region.

Accordingly, the electric field is more likely to be concentrated around an area where the connection region and the first electric field reduced region are connected to each other. Therefore, it is possible to cause avalanche breakdown to generate around the area where the connection region and the first electric field reduced region are connected to each other.

First Embodiment

FIGS. 1 to 5 show a MOSFET (metal-oxide-semiconductor field effect transistors) 10 according to the present embodiment. The MOSFET 10 has a semiconductor substrate 12. In the following, a direction parallel to an upper surface 12*a* of the semiconductor substrate 12 may be referred to as an x-direction, a direction parallel to the upper surface 12*a* and perpendicular to the x-direction may be referred to as an y-direction, and a thickness direction of the semiconductor substrate 12 may be referred to as a z-direction. As shown in FIGS. 2 to 5, electrodes, an insulating film, and the like are provided on the upper surface 12*a* of the semiconductor substrate 12. In FIG. 1, structures on the upper surface 12*a* of the semiconductor substrate 12 are not shown for explanation purposes.

The semiconductor substrate 12 is made of silicon carbide (SiC). A plurality of trenches 22 are disposed in the upper surface 12*a* of the semiconductor substrate 12. As illustrated in FIG. 1, the trenches 22 extend in parallel with each other in the upper surface 12*a*. The plurality of trenches 22 extend linearly in the y-direction. The trenches 22 are arranged to be spaced away from each other at intervals in the x-direction. A gate insulating film 24 and a gate electrode 26 are arranged inside each of the plurality of trenches 22.

The gate insulating film 24 covers an inner surface of the trench 22. The gate insulating film 24 has a side insulating film 24*a* that covers the side surface of the trench 22 and a bottom insulating film 24*b* that covers the bottom surface of the trench 22. The gate insulating film 24 is made of, e.g., silicon oxide.

Figure 2:
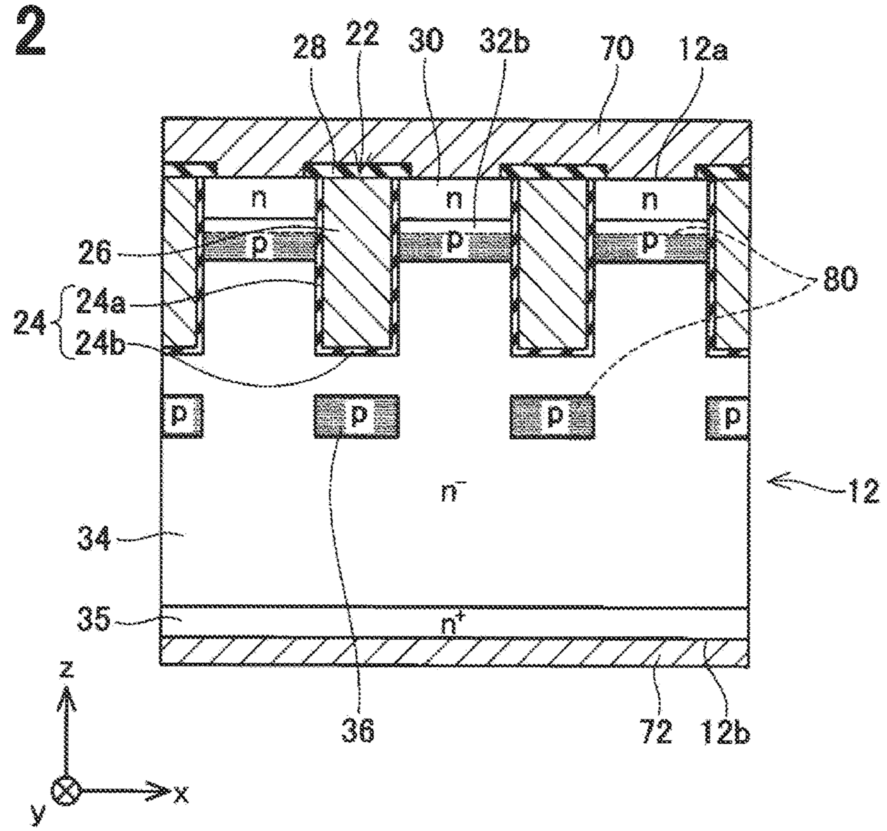
FIG. 2 is a cross-sectional view taken along a plane II in FIG. 1.
Figure 3:
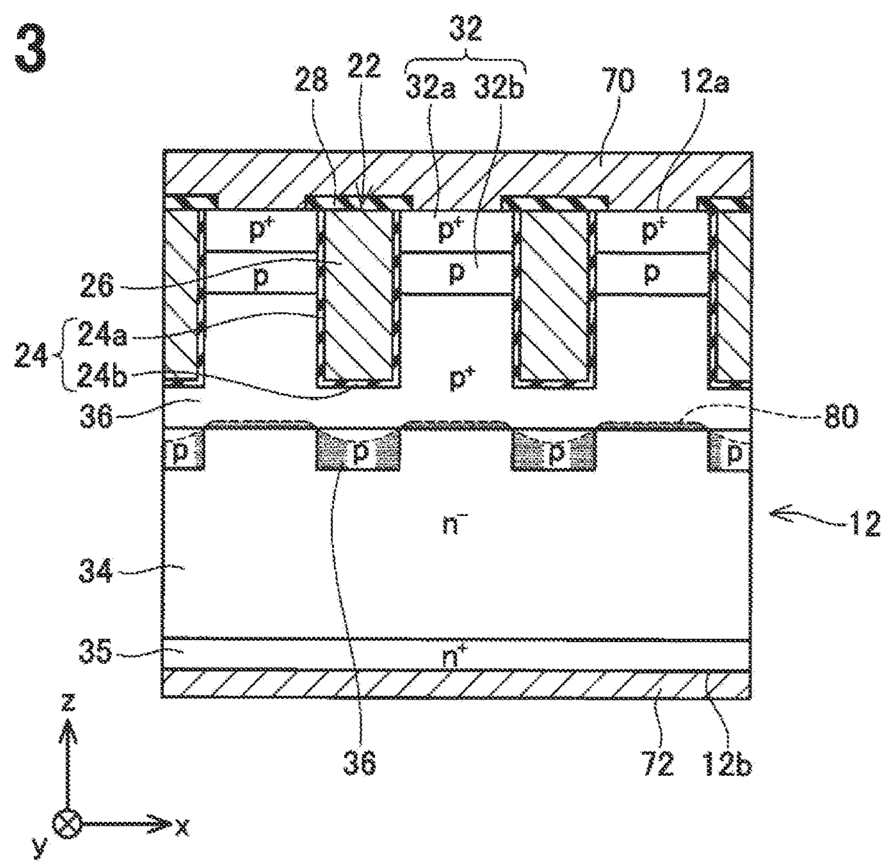
FIG. 3 is a cross-sectional view taken along a plane III in FIG. 1.
Figure 5:
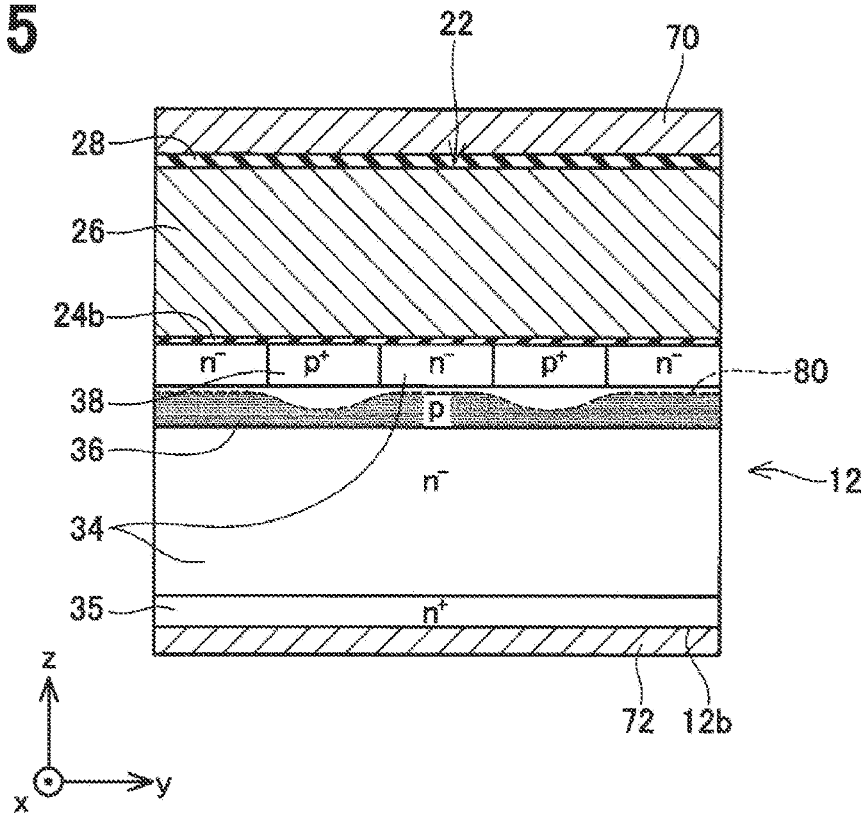
FIG. 5 is a cross-sectional view taken along a plane V in FIG. 1.

The gate electrode 26 is arranged inside the trench 22. The gate electrode 26 is insulated from the semiconductor substrate 12 by the gate insulating film 24. As shown in FIGS. 2, 3 and 5, an upper surface of the gate electrode 26 is covered with an interlayer insulating film 28.

A source electrode 70 is disposed on the upper surface 12*a* of the semiconductor substrate 12. The source electrode 70 covers the upper surface 12*a* and the interlayer insulating films 28. The source electrode 70 is in contact with the upper surface 12*a* of the semiconductor substrate 12 at portions where the interlayer insulating films 28 are not provided. The source electrode 70 is insulated from the gate electrodes 26 by the interlayer insulation films 28. A drain electrode 72 is arranged on a lower surface 12*b* of the semiconductor substrate 12. The drain electrode 72 is in contact with the lower surface 12*b* of the semiconductor substrate 12.

As shown in FIG. 1, a plurality of source regions 30, a body region 32, a drift region 34, a drain region 35, a plurality of first electric field reduced regions 36, and a plurality of connection regions 38 are provided inside the semiconductor substrate 12.

Figure 4:
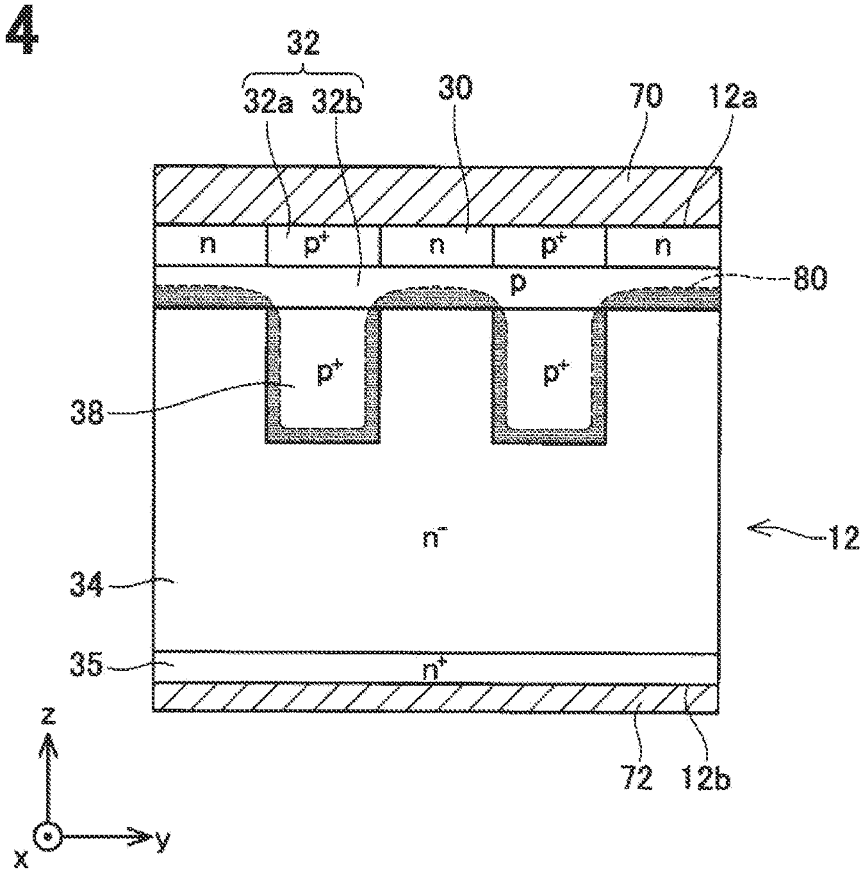
FIG. 4 is a cross-sectional view taken along a plane IV in FIG. 1.

Each of the source regions 30 is an n-type region. As shown in FIGS. 1 and 2, the plurality of source regions 30 are arranged in each of the semiconductor regions (hereinafter, referred to as "inter-trench regions") interposed between the two adjacent trenches 22. As illustrated in FIGS. 1 and 4, the source regions 30 are arranged at intervals in the y-direction at the inter-trench regions. As illustrated in FIGS. 2 and 4, each of the source regions 30 is arranged at a region exposed to the upper surface 12*a* of the semiconductor substrate 12 and is in ohmic contact with the source electrode 70. Each source region 30 is in contact with two trenches 22 located on both sides of the inter-trench region. Each source region 30 is in contact with the side insulating films 24*a* at an upper end of the trench 22.

The body region 32 is a p-type region. The body region 32 has a plurality of contact regions 32*a* and a main body region 32*b*.

Each of the contact regions 32*a* is a p-type region with higher impurity concentration. As shown in FIGS. 1 and 3, each contact region 32*a* is provided in the inter-trench region. Each of the contact regions 32*a* is arranged in a region exposed to the upper surface 12*a* of the semiconductor substrate 12. The plurality of contact regions 32*a* are arranged in each inter-trench region. As shown in FIGS. 1 and 4, in each inter-trench region, the source regions 30 and the contact regions 32*a* are alternately arranged in the y-direction. Therefore, the contact region 32*a* is arranged between the two source regions 30. Each of the contact regions 32*a* is in ohmic contact with the source electrode 70.

The main body region 32*b* is a p-type region having lower p-type impurity concentration than each of the contact regions 32*a*. As illustrated in FIGS. 1 to 4, the main body region 32*b* is arranged below the source regions 30 and the contact regions 32*a*. The main body region 32*b* is in contact with each of the source regions 30 and each of the contact regions 32*a* from a lower side. The main body region 32*b* spreads over the entire lower region of each of the source regions 30 and each of the contact regions 32*a*. As shown in FIGS. 2 and 3, the main body region 32*b* is in contact with the side insulating films 24*a* below the source region 30. The lower end of the main body region 32*b* is arranged above the lower end of the gate electrode 26.

As shown in FIGS. 3 and 4, a plurality of connection regions 38 extending downward from the main body region 32*b* are disposed below the contact region 32*a*. Each of the connection regions 38 extends downward to a position lower than the lower end of the trench 22. As shown in FIGS. 2 and 4, the connection areas 38 are not provided below the source areas 30. As shown in FIG. 3, the connection regions 38 extend in a direction (x-direction) intersecting the trench 22. As shown in FIGS. 1 and 4, similar to the contact areas 32*a*, the plurality of connection areas 38 are arranged at intervals in the y-direction. The p-type impurity concentration in each connection region 38 is higher than the p-type impurity concentration in the main body region 32*b*.

The drift region 34 is an n-type region having a low n-type impurity concentration. As shown in FIGS. 1 to 4, the drift region 34 is arranged below the body regions 32 (more specifically, the main body regions 32*b*) and the connection regions 38. The drift region 34 is in contact with the main body regions 32*b* and the connection regions 38 from lower sides thereof. Further, as shown in FIG. 4, the drift region 34 also extends into a region interposed between two connecting regions 38 that are adjacent to each other in the y-direction. That is, in a cross-section shown in FIG. 4, the drift region 34 is in contact with the connection region 38 from both sides thereof. The drift region 34 is separated from each of the source regions 30 by the main body region 32*b*. As shown in FIGS. 1 and 2, the drift region 34 extends into a region below the trenches 22 from each of inter-trench regions. As shown in FIG. 2, the drift region 34 is in contact with the side insulating films 24*a* below the main body regions 32*b*. Further, the drift region 34 is in contact with the bottom insulating films 24*b* in areas where the connection regions 38 do not exist. Below the low end of the connection region 38, the drift region 34 extends over the substantially entire area of the semiconductor substrate 12 in the x-direction and the y-direction.

The drain region 35 is an n-type region with a higher n-type impurity concentration than the drift region 34. As illustrated in FIGS. 1 to 5, the drain region 35 is arranged below the drift region 34. The drain region 35 is in contact with the drift region 34 from a lower side. The drain region 35 is provided to be exposed to the lower surface 12*b* of the semiconductor substrate 12 and is in ohmic contact with the drain electrode 72.

Each first electric field reduced region 36 is a p-type region. The p-type impurity concentration in each first electric field reduced region 36 is lower than the p-type impurity concentration in the connection region 38. Each first electric field reduced region 36 is arranged inside the drift region 34. As shown in FIGS. 1 to 3, each first electric field reduced region 36 is arranged at a position below the corresponding trench 22 with a space from the bottom surface of the trench 22. As shown in FIGS. 1 and 5, each first electric field reduced region 36 extends in the y-direction along the bottom surface of the corresponding trench 22. As shown in FIGS. 2 and 5, in the areas where the connection regions 38 do not exist, the first electric field reduced regions 36 are surrounded by the drift region 34. Therefore, the drift region 34 exists in spaces between the bottom surfaces of the trenches 22 and the first electric field reduced regions 36. In the cross-section shown in FIG. 2, the first electric field reduced region 36 is in contact with the drift region 34 on its upper surface, side surfaces and lower surface. As shown in FIG. 3, at the lower parts of the connection regions 38, the first electric field reduced region 36 is connected to lower ends of the connection regions 38. That is, each connection region 38 protrudes downward from the main body region 32*b* to reach each first electric field reduced region 36. The lower end of each first electric field reduced region 36 is positioned below the lower end of each connection region 38. As described above, the upper end of the connection region 38 is connected to the main body region 32*b*. Therefore, the first electric field reduced region 36 is connected to the main body region 32*b* via the connection region 38. Therefore, the first electric field reduced region 36 is connected to the source electrode 70 via the connection region 38, the main body region 32*b*, and the contact region 32*a*. Therefore, potential of the first electric field reduced region 36 is substantially the same as potential of the source electrode 70.

The MOSFET 10 of this embodiment is configured to satisfy the relationship of $Q>\varepsilon \cdot Ec/e$. The symbol $\varepsilon$ represents the dielectric constant (F/cm) of the connection region 38. The symbol Ec represents the critical electric field strength (V/cm) of the connection region 38. The symbol e represents the elementary charge (C). The symbol Q is an area density Q ($cm^{-2}$) of a p-type impurity in a plan view of the connection region 38 located below the trench 22 (that is, a part of the connection region 38 between the first electric field reduced region 36 and the bottom surface of the trench 22). The area density Q is a value calculated by integrating the p-type impurity concentration ($cm^{-3}$) of the connection region 38 located below the trench 22 in the z-direction. In this embodiment, since the semiconductor substrate 12 is made of silicon carbide, $\varepsilon=8.55\times10^{-13}$ (F/cm) and $Ec=2.8\times10^{6}$ (V/cm). Further, $e=1.6\times10^{-19}$ (C). Therefore, the area density Q of the connection region 38 is adjusted to satisfy $Q>1.49\times10^{13}$.

When the MOSFET 10 is used, a higher potential is applied to the drain electrode 72 than a potential applied to the source electrode 70. When a voltage equal to or higher than a gate threshold value is applied to the gate electrode 26, a channel is formed in a region of the main body region 32*b* that is in contact with the gate insulating film 24, and then the switching element 10 is turned on. When the voltage applied to the gate electrode 26 is lowered to be less than the gate threshold value, the channel disappears and the MOSFET 10 is turned off.

When the MOSFET 10 is off, the potential of the drain electrode 72 is much higher than the potential of the source electrode 70. During this state, the drift region 34 has a potential close to that of the drain electrode 72. Further, as described above, the first electric field reduced region 36 has a potential substantially equal to that of the source electrode 70. Therefore, a high reverse voltage is applied to the pn junction at the interface between the drift region 34 and the first electric field reduced region 36. Therefore, a depletion layer extends over a wide area from the first electric field reduced region 36 to the drift region 34. As a result, the withstand voltage of the MOSFET 10 is ensured.

When the MOSFET 10 is turned off, the drift region 34 is depleted, and the depletion layers 80 (the dot-hatched region) also spread into the p-type regions (that is, the first electric field reduced regions 36, the connection regions 38, and the body regions 32). In the regions where the connection regions 38 do not exist, as shown in FIG. 2, the depletion layers 80 spreads over substantially the entire area of the first electric field reduced regions 36, and the depletion layers 80 extend from the drift region 34 to a part of each of the main body regions 32*b*. As shown in FIG. 4, the depletion layers 80 extend into the inside of the p-type regions along the interface between the p-type region (i.e., the connection region 38 and the main body region 32*b*) and the drift region 34. In the MOSFET 10 of this embodiment, the p-type impurity concentration in the connection region 38 is higher than the p-type impurity concentration in the first electric field reduced region 36. Therefore, the connection regions 38 are less likely to be depleted than the first electric field reduced regions 36. Further, since the concentration of p-type impurity in the connection region 38 is high, a part of the first electric field reduced region 36 adjacent to the connection region 38 is less likely to be depleted than other parts of the first electric field reduced region 36. Therefore, as shown in FIGS. 3 and 5, the depletion layer 80 is curved in areas where both the first electric field reduced region 36 and the connection regions 38 exist. That is, the non-depleted region remains in the first electric field reduced region 36 at positions below the connection regions 38. As a result, the equipotential lines are curved in the areas below the connection regions 38, and the distance between the equipotential lines narrows. As described above, in the MOSFET 10 of the present embodiment, the electric field is concentrated around the area where the connection region 38 and the first electric field reduced region 36 are connected to each other. Therefore, avalanche breakdown is likely to occur around the area where the connection region 38 and the first electric field reduced region 36 are connected to each other. The holes generated due to the avalanche breakdown flow to the source electrode 70 via the connection region 38 and the body region 32. Here, when the area density Q of the connection region 38 satisfies the above-mentioned equation, the depletion layers 80 spreading in the connection regions 38 do not reach the lower end of each trench 22. That is, even if an electric field having a critical electric field strength is applied to the connection regions 38, the depletion layers 80 do not reach the lower end of the trenches 22. Therefore, a non-depleted region remains in the connecting region 38 around the lower end of the trench 22. In the non-depleted region, the moving speed of the holes is slower than in the depleted region. Therefore, the non-depleted region prevents the holes flowing through the connection region 38 (i.e., the holes generated in the vicinity of the connection region 38 due to avalanche breakdown) from entering into the gate insulating film 24, and thus most of the holes flow to the source electrode 70. Therefore, in this MOSFET 10, even when an avalanche breakdown occurs, it is possible to suppress a change in the characteristics of the gate insulating film 24.

Second Embodiment

Figure 6:
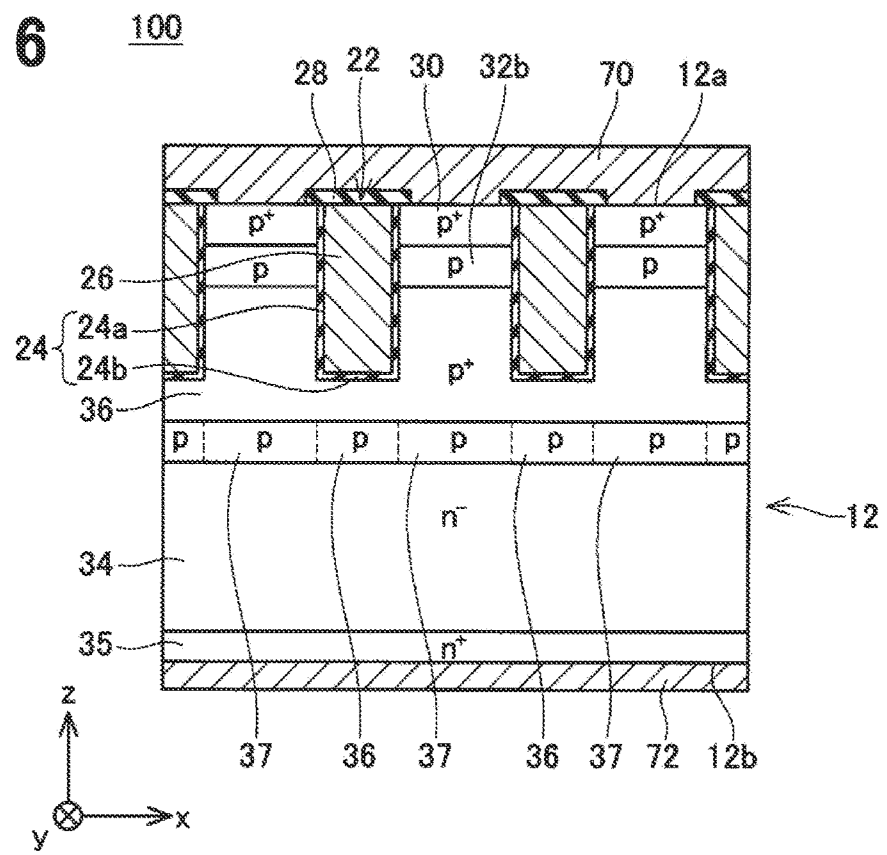
FIG. 6 is a cross-sectional view of a MOSFET according to a second embodiment corresponding to the MOSFET shown in FIG. 3.
Figure 7:
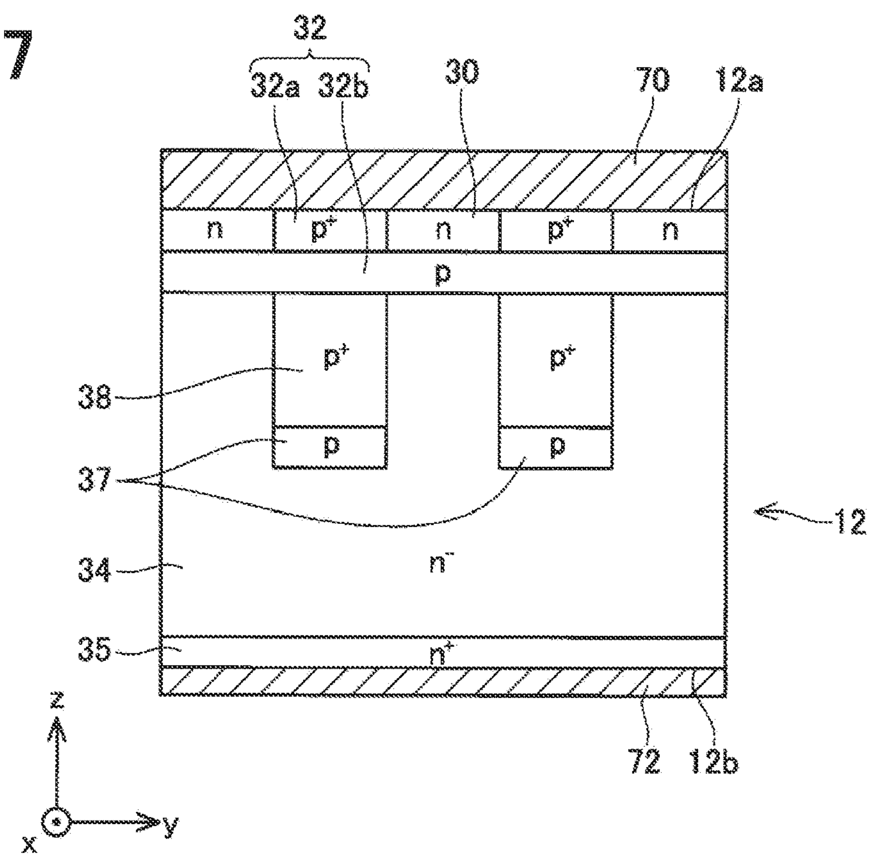
FIG. 7 is a cross-sectional view of a MOSFET according to the second embodiment corresponding to the MOSFET shown in FIG. 4.
Figure 8:
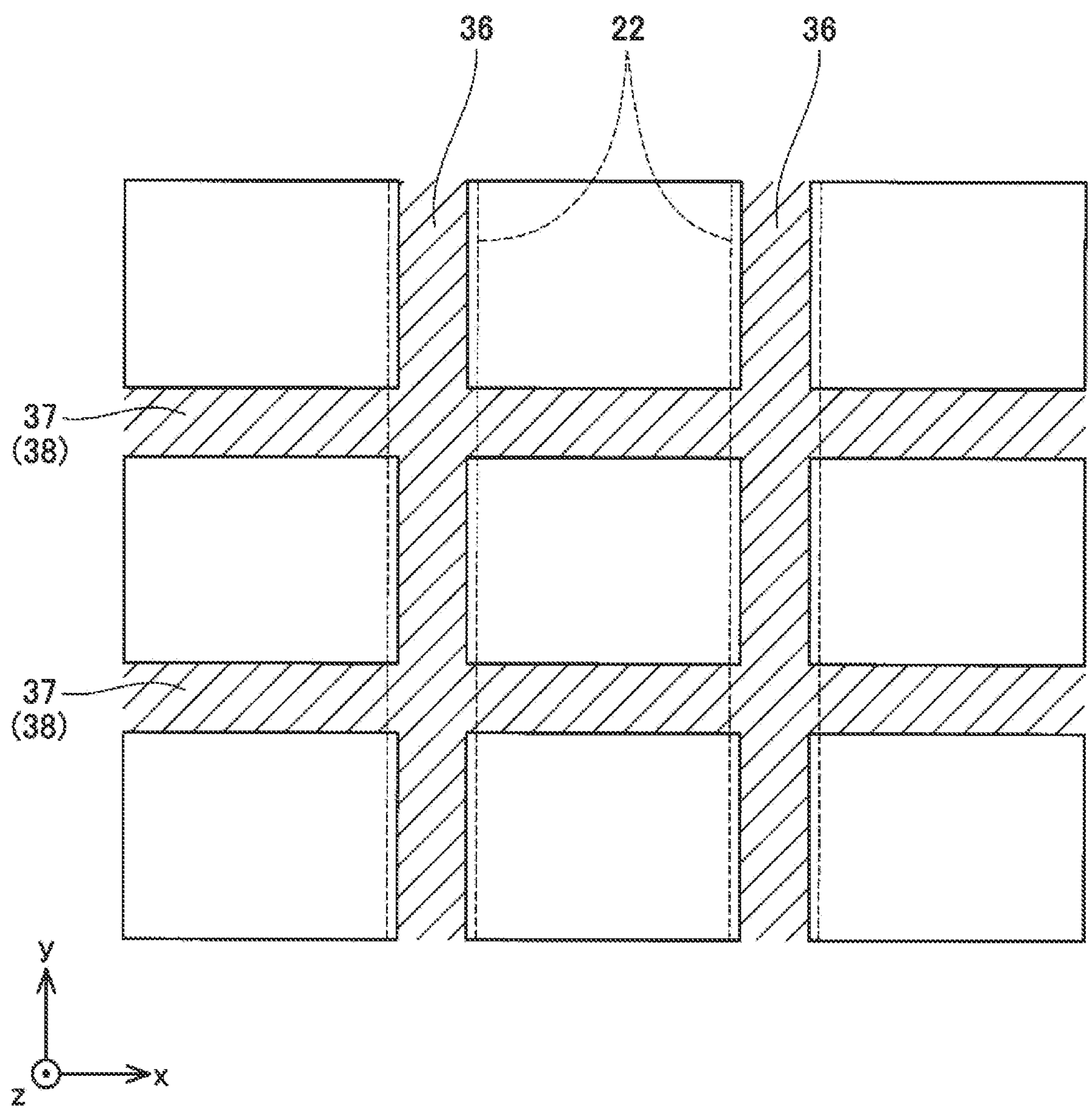
FIG. 8 is a plan view of the MOSFET according to the second embodiment.

FIGS. 6 to 8 show a MOSFET 100 according to the second embodiment. FIG. 6 shows a cross-section corresponding to FIG. 3 of the first embodiment, and FIG. 7 shows a cross-section corresponding to FIG. 4 of the first embodiment. Further, FIG. 8 shows a plan view of a semiconductor substrate 12 viewed from an upper side. Hereinafter, the same components as those in the first embodiment are designated by the same reference numerals, and the description thereof will be omitted. In addition to the configuration of the first embodiment, the MOSFET 10 of the second embodiment has a plurality of second electric field reduced regions 37 inside the semiconductor substrate 12. In FIG. 8, the first electric field reduced regions 36 and the second electric field reduced regions 37 are shown by hatching.

As shown in FIG. 7, each second electric field reduced region 37 is located below the corresponding connection region 38. Each second electric field reduced region 37 is connected to the corresponding connection region 38. The upper end of each second electric field reduced region 37 is connected to the lower end of the corresponding connection region 38. As shown in FIG. 6, each second electric field reduced region 37 is arranged at substantially the same depth as each first electric field reduced region 36. As shown in FIGS. 6 and 8, each second electric field reduced region 37 extends to intersect the plurality of first electric field reduced regions 36. That is, each second electric field reduced region 37 extends in the x-direction along the lower end of the corresponding connection region 38. Each second electric field reduced region 37 connects the plurality of first electric field reduced regions 36 to each other. That is, as shown in FIG. 8, each first electric field reduced region 36 and each second electric field reduced region 37 are arranged in a grid pattern in a plan view. Each second electric field reduced region 37 has substantially the same p-type impurity concentration as each first electric field reduced region 36.

In this embodiment, the second electric field reduced region 37 having a lower p-type impurity concentration than the connection region 38 is arranged below the connection region 38. Therefore, when the MOSFET 100 is off, the second electric field reduced region 37 is depleted, and the electric field applied to the connection region 38 is reduced. Further, the first electric field reduced region 36 and the second electric field reduced region 37 are arranged in a grid pattern in a plan view. Therefore, in the drift region 34 surrounded by the first electric field reduced region 36 and the second electric field reduced region 37, and the drift region 34 in the inter-trench region located above the drift region 34, the depletion layer quickly expands from the first electric field reduced regions 36 and the second electric field reduced regions 37. As described above, since the depletion layer spreads rapidly in the drift region 34, the capacity between the drain and the source of the MOSFET 100 decreases. As a result, the output capacity of the MOSFET 100 can be reduced, and the loss caused by the MOSFET 100 can be reduced. For example, when the MOSFET 100 is operated as a diode, the recovery loss can be reduced.

In each of the above-described embodiments, the connection region 38 is provided below the contact region 32*a*. However, the connection region 38 may not be provided below the contact region 32*a*, and may be provided, for example, below the source region 30.

Further, in each of the above-described embodiments, the semiconductor substrate 12 is made of silicon carbide. However, the semiconductor substrate 12 may be made of other semiconductor materials such as silicon (Si) and gallium nitride (GaN). In this case, the area density Q may be appropriately set based on the dielectric constant of the material adopted and the strength of the critical electric field.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

The invention claimed is:

1. A switching element, comprising:

a semiconductor substrate that has an upper surface on which a trench is disposed;

a gate insulating film that covers an inner surface of the trench; and a gate electrode that is disposed inside the trench, the gate electrode being insulated from the semiconductor substrate by the gate insulating film, wherein the semiconductor substrate further includes:

an n-type source region in contact with the gate insulating film on a side of the trench;

a p-type body region in contact with the gate insulating film on the side below the source region;

an n-type drift region that is arranged below the body region, the n-type drift region being in contact with the gate insulating film on the side below the body region and with the gate insulating film at a bottom surface of the trench;

a p-type first electric field reduced region that is arranged inside the drift region below the trench to be spaced away from the bottom surface of the trench, the p-type first electric field reduced region extending along the bottom surface of the trench; and a p-type connection region that protrudes downward from the body region to reach the first electric field reduced region, the p-type connection region extending in a direction intersecting the trench when viewed in a plan view, a permittivity of the connection region is ε(F/cm), a critical electric field strength of the connection region is Ec (V/cm), an elementary charge is e (C), and an area density of p-type impurity when viewed in a plan view of the connection region located below the trench is Q ($cm^{-2}$), $$Q>\varepsilon*Ec/e,$$

a p-type impurity concentration in the connection region is higher than a p-type impurity concentration in the first electric field reduced region, the switching element further comprises a source electrode disposed on the upper surface of the semiconductor substrate, the body region further includes:

a contact region in ohmic contact with the source electrode; and a main body region having lower p-type impurity concentration than the contact region, the main body region being in contact with the source region and the contact region from a lower side and in contact with the gate insulating film below the source region, the connection region protrudes downward from the main body region, and the connection region has higher p-type impurity concentration than the p-type impurity concentration of the main body region.

2. The switching element according to claim 1, wherein the semiconductor substrate is made of silicon carbide, and $$Q>1.49\times10^{13}.$$

3. The switching element according to claim 1, wherein the trench are a plurality of trenches on the upper surface of the semiconductor substrate, the connection region are a plurality of connection regions, the first electric field reduced region are a plurality of first electric field reduced regions, the switching element further includes a plurality of p-type second electric field reduced regions, each of the plurality of first electric field reduced regions is located below a corresponding one of the plurality of trenches, each of the plurality of connection regions extends to intersect the plurality of trenches, and each of the plurality of second electric field reduced regions is located below a corresponding one of the plurality of connection regions, is connected to the corresponding one of the plurality of connection regions, and extends to intersect the plurality of first electric field reduced regions.

* * * * *